(12) United States Patent
Sung et al.

(10) Patent No.: US 8,927,091 B2
(45) Date of Patent: *Jan. 6, 2015

(54) DISPLAY DEVICE AND MANUFACTURING METHOD THEREOF

(75) Inventors: Un-cheol Sung, Anyang-si (KR); Hoon Kim, Hwaseong-si (KR); Sang-pil Lee, Seoul (KR); Sung-soo Lee, Suwon-si (KR)

(73) Assignee: Samsung Display Co., Ltd. (KR)

( * ) Notice: Subject to any disclaimer, the term of this patent is extended or adjusted under 35 U.S.C. 154(b) by 963 days.

This patent is subject to a terminal disclaimer.

(21) Appl. No.: 11/685,524

(22) Filed: Mar. 13, 2007

(65) Prior Publication Data

US 2007/0212525 A1    Sep. 13, 2007

(30) Foreign Application Priority Data

Mar. 13, 2006   (KR) .................. 10-2006-0023080

(51) Int. Cl.
*B05D 5/00*       (2006.01)
*B32B 23/02*      (2006.01)
*B29C 65/00*      (2006.01)
*H01L 23/28*      (2006.01)
*H01L 51/52*      (2006.01)
*G02F 1/1333*     (2006.01)
*H01L 27/32*      (2006.01)

(52) U.S. Cl.
CPC ...... *H01L 51/5246* (2013.01); *G02F 2001/133388* (2013.01); *H01L 27/3244* (2013.01); *H01L 51/5259* (2013.01)
USPC ........ 428/195.1; 428/192; 427/258; 156/277; 156/274.4; 156/275.5; 257/787; 257/E51.02

(58) Field of Classification Search
CPC ............... G02F 2001/133388; H01L 27/3244; H01L 51/5246; H01L 51/5259
USPC .......................................... 427/258; 156/277
See application file for complete search history.

(56) References Cited

U.S. PATENT DOCUMENTS

| | | | | |
|---|---|---|---|---|
| 4,278,326 A | * | 7/1981 | Kawamura et al. | 349/132 |
| 2002/0155320 A1 | * | 10/2002 | Park et al. | 428/690 |
| 2003/0080953 A1 | * | 5/2003 | Ting | 345/206 |
| 2004/0061437 A1 | * | 4/2004 | Ikagawa | 313/506 |
| 2004/0069017 A1 | * | 4/2004 | Li et al. | 65/43 |
| 2004/0075380 A1 | * | 4/2004 | Takemoto et al. | 313/500 |
| 2005/0093439 A1 | * | 5/2005 | Harada et al. | 313/506 |
| 2006/0001041 A1 | * | 1/2006 | Peng | 257/103 |
| 2007/0096631 A1 | * | 5/2007 | Sung et al. | 313/498 |

FOREIGN PATENT DOCUMENTS

| | | | |
|---|---|---|---|
| JP | 2000-138029 | * | 5/2000 |
| JP | 2005353378 | | 12/2005 |
| KR | 1020010109011 | | 12/2001 |
| KR | 1020030080895 | | 10/2003 |
| KR | 2005-0103745 | * | 11/2005 |

* cited by examiner

*Primary Examiner* — Gerard Higgins
*Assistant Examiner* — Sathavaram I Reddy
(74) *Attorney, Agent, or Firm* — Cantor Colburn LLP

(57) ABSTRACT

A display device and method thereof which minimizes introduction of oxygen and moisture from the outside includes an insulating substrate, a display part formed on the insulating substrate, a cover substrate combined with the insulating substrate, a filler provided between the insulating substrate and the cover substrate, the filler includes a first region and a second region spaced from the first region and formed at a circumference of the first region, and a moisture absorbent formed in a space between the first region and the second region.

25 Claims, 9 Drawing Sheets

DISPLAY DEVICE AND MANUFACTURING METHOD THEREOF

This application claims priority to Korean Patent Application No. 2006-0023080, filed on Mar. 13, 2006, and all the benefits accruing therefrom under 35 U.S.C. §119, the contents of which in its entirety are herein incorporated by reference.

BACKGROUND OF THE INVENTION

1. Field of the Invention

The present invention relates to a display device and a manufacturing method thereof, and more particularly, to a display device which minimizes introduction of oxygen and moisture from the outside, and a manufacturing method thereof.

2. Description of the Related Art

An organic light emitting diode ("OLED") has been drawing recent attention since it is driven with a low voltage, is lightweight and small in size, provides a wide viewing angle and has a fast response speed. The OLED comprises a thin film transistor which includes a gate electrode, a source electrode and a drain electrode; a pixel electrode connected with the thin film transistor; walls which define the pixel electrode; an organic light emitting layer formed on the pixel electrode between the walls; and a common electrode formed on the organic light emitting layer.

The organic light emitting layer is easily affected by moisture and oxygen, and thus is likely to deteriorate easily. An insulating substrate having the organic light emitting layer and a cover substrate preventing moisture and oxygen from being introduced therein are sealed to each other to prevent deterioration of the organic light emitting layer. The insulating substrate and the cover substrate are sealed to each other by forming a sealant along the entire surfaces or the edges of two substrates.

The sealant comprises an organic material and has a high moisture transmittivity, thereby possibly introducing moisture to a space between two substrates.

BRIEF SUMMARY OF THE INVENTION

Accordingly, it is an aspect of the present invention to provide a display device which minimizes introduction of oxygen and moisture from the outside, and a manufacturing method thereof.

Additional aspects, features and/or advantages of the present invention will be set forth in part in the description which follows and, in part, will be obvious from the description, or may be learned by practice of the present invention.

The foregoing and/or other aspects, features and advantages of the present invention can be achieved by providing a display device including an insulating substrate, a display part formed on the insulating substrate, a cover substrate combined with the insulating substrate, a filler provided between the insulating substrate and the cover substrate, and includes a first region and a second region spaced from the first region and formed at a circumference of the first region, and a moisture absorbent formed in a space between the first region and the second region.

The display device may further include a heat wire disposed in the moisture absorbent.

The filler may include a sealant which adheres the insulating substrate and the cover substrate together.

The filler may include an organic material.

The first region may cover the entire display part.

The first region may be formed at a circumference of the insulating substrate.

The insulating substrate includes a display region having a gate line and a data line insulatively crossing each other, and a non-display region provided at a circumference of the display region, and the insulating substrate further includes a driving voltage supply provided in the non-display region and in parallel with the gate line, and a common voltage supply provided between gate pads of the gate line.

The driving voltage supply may include a driving voltage bar substantially parallel with the gate line, and a driving voltage pad connected with the driving voltage bar, and the heat wire overlaps a part of at least one of the driving voltage supply and the common voltage supply.

The heat wire varies in width in an overlapping part and nonoverlapping part thereof.

The width of the heat wire which does not overlap the at least one of the driving voltage supply and the common voltage supply may be larger than the width thereof which overlaps the at least one of the driving voltage supply and the common voltage supply.

The width of the space between the first region and the second region may be in a range of about 0.5 mm to about 20 mm.

The moisture absorbent may be a liquid dropped on the space, and cured by heat.

The heat wire may be exposed between the insulating substrate and the cover substrate.

An exposure hole may be formed on one of the insulating substrate and the cover substrate, and the heat wire may be exposed through the exposure hole.

The foregoing and/or other aspects, features and advantages of the present invention may be achieved by providing a method of manufacturing a display device, the method including forming a display part on an insulating substrate, forming a filler having a first region and a second region spaced from the first region and formed at a circumference of the first region, on the insulating substrate, disposing a heat wire in a space between the first region and the second region, forming a moisture absorbent in the space to cover the heat wire, adhering the insulating substrate to the cover substrate, and curing the moisture absorbent by supplying power to the heat wire.

The method may further include semi-curing the filler before disposing the heat wire.

The filler may include an organic material formed by a screen printer.

The moisture absorbent may be a liquid, and disposed by one of a dispenser or screen-printing method.

The curing the moisture absorbent may include supplying power to the heat wire to rise to a temperature of about 70° C. to about 300° C.

The curing the moisture absorbent may include curing the moisture absorbent in a vacuum and inert gas.

The filler may include an opening part to expose the heat wire between the insulating substrate and the cover substrate, and the method may further include sealing the opening part after curing the moisture absorbent.

An exposure hole may be formed on one of the insulating substrate and the cover substrate to expose the heat wire, and the method may further include sealing the exposure hole after curing the moisture absorbent.

The method may further include removing the heat wire after curing the moisture absorbent.

BRIEF DESCRIPTION OF THE DRAWINGS

The above and/or other aspects, features and advantages of the present invention will become apparent and more readily appreciated from the following description of the exemplary embodiments, taken in conjunction with the accompanying drawings, in which.

DETAILED DESCRIPTION OF THE INVENTION

Figure 1:
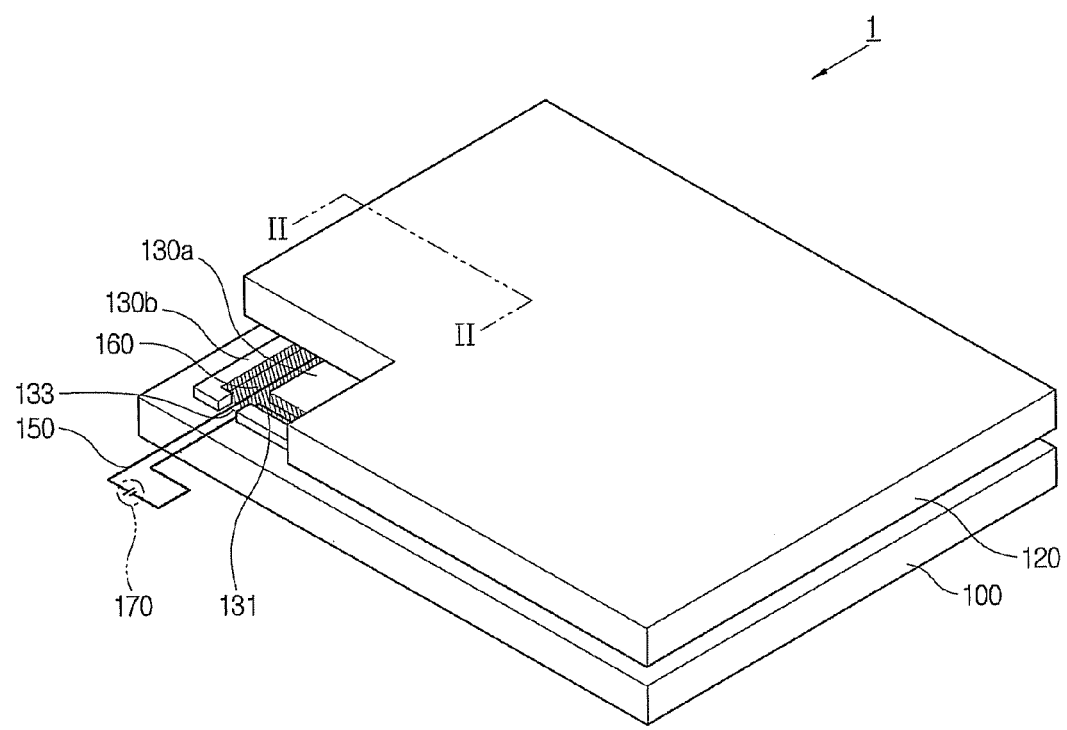
FIG. 1 is a perspective view illustrating a display device according to a first exemplary embodiment of the present invention.

Hereinafter, embodiments of the present invention will be described with reference to accompanying drawings, wherein like numerals refer to like elements and repetitive descriptions will be avoided as necessary. This invention may, however, be embodied in many different forms and should not be construed as limited to the embodiments set forth herein. Rather, these embodiments are provided so that this disclosure will be thorough and complete, and will fully convey the scope of the invention to those skilled in the art.

Further, a term of "on" means that a new layer (i.e., film) may be interposed or not interposed between two layers (i.e., films), and a term of "directly on" means that two layers (i.e., films) are in contact with each other. As used herein, the term "and/or" includes any and all combinations of one or more of the associated listed items.

It will be understood that, although the terms first, second, third, etc., may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of the present invention.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" and/or "comprising," or "includes" and/or "including" when used in this specification, specify the presence of stated features, regions, integers, steps, operations, elements, and/or components, but do not preclude the presence or addition of one or more other features, regions, integers, steps, operations, elements, components, and/or groups thereof.

Spatially relative terms, such as "beneath", "below", "lower", "above", "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and the present disclosure, and will not be interpreted in an idealized or overly formal sense unless expressly so defined herein.

Embodiments of the present invention are described herein with reference to cross section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, a region illustrated or described as flat may, typically, have rough and/or nonlinear features. Moreover, sharp angles that are illustrated may be rounded. Thus, the regions illustrated in the figures are schematic in nature and their shapes are not intended to illustrate the precise shape of a region and are not intended to limit the scope of the present invention.

Figure 2:
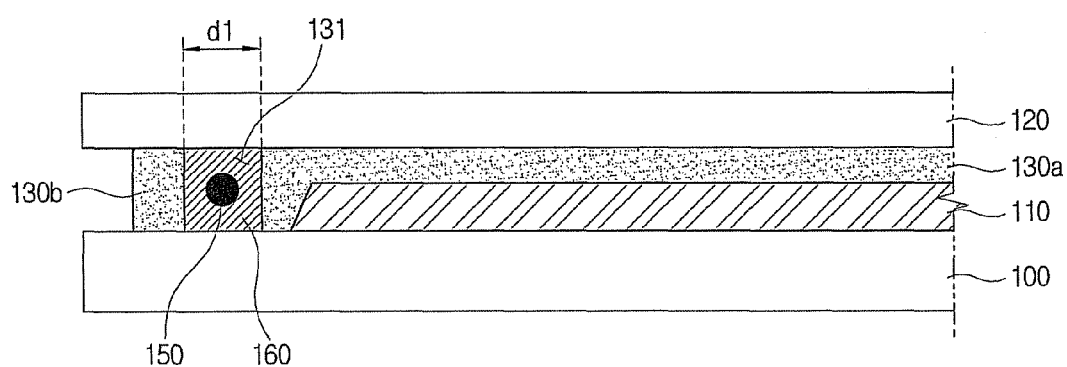
FIG. 2 is a cross-sectional view of the display device according to the first embodiment of the present invention, taken along line II-II in FIG. 1.
Figure 3:
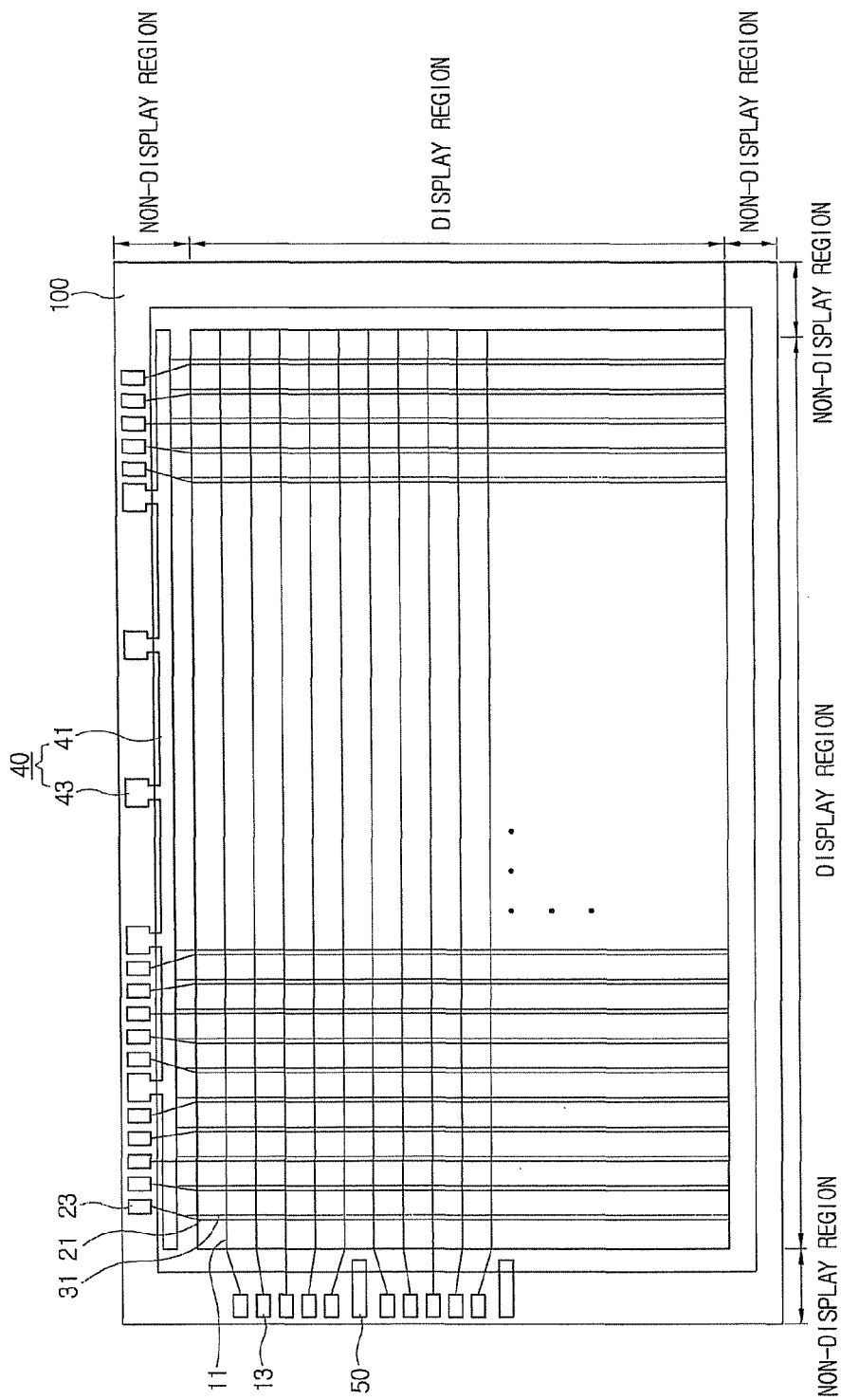
FIG. 3 is a plan view illustrating the display device according to the first exemplary embodiment of the present invention.
Figure 4:
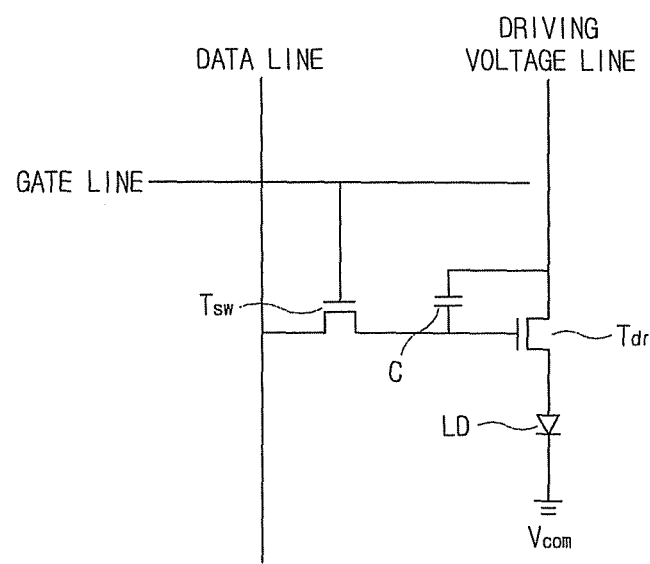
FIG. 4 is an equivalent circuit schematic with respect to a pixel of the display device according to the first exemplary embodiment of the present invention.

FIG. 1 is a perspective view illustrating a display device according to a first exemplary embodiment of the present invention. FIG. 2 is a cross-sectional view of the display device according to the first exemplary embodiment of the present invention, taken along line II-II in FIG. 1. FIG. 3 is a plan view illustrating the display device according to the first exemplary embodiment of the present invention. FIG. 4 is a circuit schematic diagram illustrating an equivalent circuit with respect to a pixel of the display device according to the first exemplary embodiment of the present invention.

Generally, an organic light emitting diode ("OLED") 1 emits light by receiving an electrical signal, and is easily affected by moisture and oxygen. Therefore, an encapsulation method is desired to prevent oxygen and moisture from being introduced to the organic light emitting layer.

As shown in FIG. 2, the OLED 1 according to the first exemplary embodiment of the present invention comprises an insulating substrate 100 which includes a display part 110 to display an image thereon; a cover substrate 120 adhered to the insulating substrate 100 and which prevents oxygen or moisture from being introduced to the display part 110; a filler 130 (shown as 130a and 130b) which covers the display part 110 and is disposed between the insulating substrate 100 and the cover substrate 120; a moisture absorbent 160 which fills a groove 131 formed at a circumference of the filler 130; and a heat wire 150 which is inserted into the moisture absorbent 160.

The insulating substrate 100 may comprise a transparent material such as glass or plastic. A blocking layer (not shown)

may be formed on a front part of the insulating substrate, e.g., between the display part 110 and the insulating substrate 100. The blocking layer blocks oxygen or moisture which may be introduced to the display part 110 through the insulating substrate 100. The blocking layer comprises SiON, $SiO_2$, SiNx, or $Al_2O_3$. The blocking layer may be formed by a sputtering method.

The display part 110 is provided by known methods, and thus the elements thereof are not shown. The display part 110 comprises a thin film transistor having a gate electrode, a source electrode and a drain electrode; a pixel electrode connected with the thin film transistor; a wall defining pixel electrodes; an organic light emitting layer formed on the pixel electrode between the walls; and a common electrode formed on the organic light emitting layer.

As shown in FIGS. 3 and 4, a display region of the display device comprises a gate line 11 which extends in a horizontal direction, as illustrated in FIG. 3; a data line 21 which insulatively intersects the gate line 11 and defines a pixel region; a driving voltage line 31 which is substantially parallel with the data line 21; a switching thin film transistor Tsw which is formed on an intersection of the gate line 11 and the data line 21; and a driving thin film transistor Tdr which is formed on the intersection of the gate line 11 and the driving voltage line 31.

A gate pad 13 and a data pad 23 are formed on a non-display region of the display device. The gate pad 13 is connected with an end part of the gate line 11. The data pad 23 is connected with an end part of the data line 21. The gate pad 13 and the data pad 23 are respectively connected with a gate driver (not shown) and a data driver (not shown) to receive various driving signals from the outside.

A driving voltage supply 40 is provided on the non-display region and connected with an end part of the driving voltage line 31. The driving voltage supply 40 comprises a driving voltage bar 41 which is substantially parallel with the gate line 11; and a driving voltage pad 43 connected with the driving voltage bar 41. The driving voltage pad 43 supplies a driving voltage from the outside to the driving voltage bar 41. The driving voltage line 31 receives power from the outside through the driving voltage bar 41 and the driving voltage pad 43 to transmit the power to the driving thin film transistor Tdr. The driving thin film transistor Tdr supplies a regular voltage to the pixel electrode to transmit a hole and an electron within the organic light emitting layer. The organic light emitting layer is formed on the pixel electrode to emit light by a voltage from the pixel electrode. A common voltage supply 50 is formed between the gate pads 13. The common voltage supply 50 is electrically connected with the common electrode applied across the display region, and supplies a common voltage to the common electrode.

As shown in FIG. 4, each pixel comprises an organic light emitting device LD, the switching thin film transistor Tsw, the driving thin film transistor Tdr and a capacitor C. The driving thin film transistor Tdr is a three terminal device comprising a control terminal, an input terminal and an output terminal. The control terminal is connected with an output terminal of the switching thin film transistor Tsw and one terminal of the capacitor. The input terminal is connected with the driving voltage line 31 and the other terminal of the capacitor C. The output terminal is connected with the organic light emitting device LD.

The organic light emitting device LD comprises the pixel electrode as an anode connected with the output terminal of the driving thin film transistor Tdr; the common electrode as a cathode connected with a common voltage Vcom; and the organic light emitting layer disposed between the common electrode and the pixel electrode. The organic light emitting device LD emits light with varying intensities depending on an output current of the driving thin film transistor Tdr. The current of the driving thin film transistor Tdr varies according to a voltage transmitted between the control terminal and the output terminal thereof.

The switching thin film transistor Tsw is a three terminal device comprising a control terminal, an input terminal and an output terminal. The control terminal is connected with the gate line 11. The input terminal is connected with the data line 21. The output terminal is connected with the control terminal of the driving thin film transistor Tdr. The switching thin film transistor Tsw transmits a data signal supplied to the data line 21 according to a scanning signal on the gate 11, to the driving thin film transistor Tdr.

The capacitor C is connected between the control terminal and the input terminal of the driving thin film transistor Tdr. The capacitor C charges and maintains the data signal input to the control terminal of the driving thin film transistor Tdr.

The cover substrate 120 may comprise the same material as the insulating substrate 100, but is not limited thereto. Alternatively, the cover substrate 120 may comprise soda-lime glass substrate, a boro-silicate glass substrate, a silicate glass substrate and a lead glass substrate, for example, but is not limited thereto. The cover substrate 120 may be about 0.1 mm to about 10 mm thick to prevent moisture or oxygen from being introduced to the display part 110 through the cover substrate 120. In exemplary embodiments, the cover substrate 120 may be about 1 mm to about 10 mm thick.

The filler 130 (e.g., 130a and 130b) is formed between the insulating substrate 100 and the cover substrate 120. The filler 130 may comprise a sealant. The filler 130 adheres the insulating substrate 100 and the cover substrate 120 together with each other while protecting the organic light emitting layer from moisture or oxygen. The filler 130 comprises an adhesive organic material which covers the display part 110.

As seen in FIGS. 1 and 2, the filler 130 comprises a first region 130a and a second region 130b which is spaced from the first region 130a and formed at a circumference of the first region 130a defining the groove or space 131 between the first region 130a and the second region 130b. The space 131 is disposed on the non-display region. The filler 130 which includes the space 131 may be formed on the insulating substrate 100 by using a screen printer having a mask. The mask of the screen printer is partially closed corresponding to the space 131. The width d1 of the space 131 may be about 0.5 mm to about 20 mm. When the width d1 of the space 131 is smaller than 0.5 mm, the heat wire 150 and the moisture absorbent 160 may be hardly formed therein, and the performance of the moisture absorbent 160 may be lowered. Although the performance of the moisture absorbent 160 is not affected much when the width d1 of the space 131 is 20 mm or more, the width d1 thereof is not required to be larger than 20 mm. In addition, it is difficult to form the moisture absorbent 160 with a width of 20 mm or more on the non-display region according to the size of the display device. An opening part 133 is formed at a lateral side of the filler 130 through which the heat wire 150 (to be described later) is exposed. The filler 130 may be cured by at least one of heat or light.

The heat wire 150 is provided in the space 131. The heat wire 150 may be provided as a plurality of wires in alternative exemplary embodiments. Opposite ends of the heat wire 150 exposed by the opening part 133 are connected with a power supply 170 (to be described later). When the heat wire 150 receives power from the power supply 170, heat is emitted by resistance of the heat wire 150 to cure the moisture absorbent 160, which is a liquid before heating. The heat wire 150 may comprise at least one of nickel, tungsten, kanthal, and alloys of the foregoing. The heat wire 150 may be formed by a sputtering or chemical vapor deposition ("CVD") method. The heat wire 150 may be additionally inserted into the space 131. The heat wire 150 is thick enough to emit heat to cure the moisture absorbent 160 and not to generate malfunction in metal wiring on the display part 110, that is, the gate line 11, the data line 21, the driving voltage line 31, the driving voltage supply 40 and the common voltage supply 50. The gate line 11 or the data line 21 may comprise aluminum which has a low melting point and changes in resistance at high temperature. Therefore, if the aluminum gate line 11 or the data line 21 is affected by higher temperature, the resistance thereof changes resulting in an image signal that is not properly transmitted to display a desired image.

As shown in FIG. 3, the heat wire 150 may at least partially overlap at least one of the driving voltage supply 40 and the common voltage supply 50. The width of the heat wire 150 overlapping the driving voltage supply 40 and the common voltage supply 50 may be different from the width of the heat wire 150 which does not overlap them. In exemplary embodiments, the width of the heat wire 150 not overlapping the driving voltage supply 40 and the common voltage supply 50 is larger than the width of the heat wire 150 which overlaps the driving voltage supply 40 and the common voltage supply 50. When the width of the heat wire 150 overlapping the driving voltage supply 40 and the common voltage supply 50 is smaller, an interaction (electrical interference) between the heat wire 150 and the driving voltage supply 40 and/or the common voltage supply 50 is minimized. When the width of the heat wire 150 which does not overlap the driving voltage supply 40 and the common voltage supply 50 is larger, the moisture absorbent 160 is cured. The heat wire 150 may be removed after curing the moisture absorbent 160.

The space 131 is filled with the moisture absorbent 160. The moisture absorbent 160 prevents oxygen or moisture from being introduced to the space 131. The moisture absorbent 160 may comprise plastic which is cured by heat. With low moisture and oxygen transmittivity, the moisture absorbent 160 may prevent the organic light emitting layer from being deteriorated. Then, the life span and performance of the display device is improved. The moisture absorbent 160 may be formed in the space 131 through a dispensing or screen printing method. The moisture absorbent 160 may comprise various known products known in the art or that will become known, for example, known products include "Drylox" of Dupont, or "DESIPASTE" of Sued Chemie AG.

The power supply 170 is connected with opposite ends of the heat wire 150. The OLED 1 does not include the power supply 170 in the finished product. The power supply 170 is removed after supplying power to the heat wire 150 to cure the moisture absorbent 160. The power supply 170 may comprise any known device which supplies electrical power. Also, the power supply 170 may comprise a radio frequency ("RF") power source which supplies electrical power at high frequency.

Figure 5A:
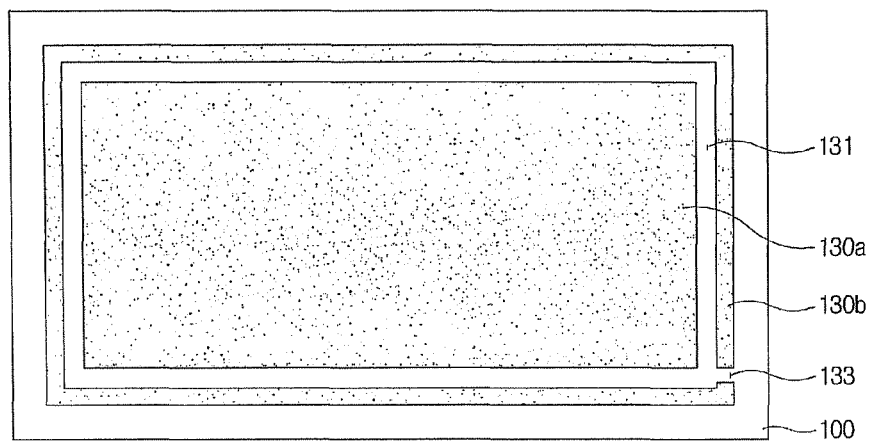
FIGS. 5a to 5c are plan views illustrating a method of manufacturing the display device according to the first exemplary embodiment of the present invention.
Figure 5B:
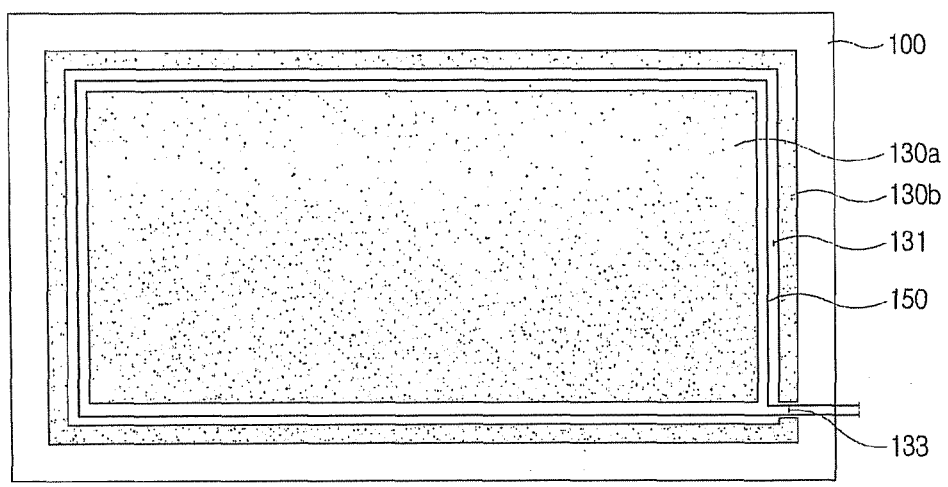
Figure 5C:
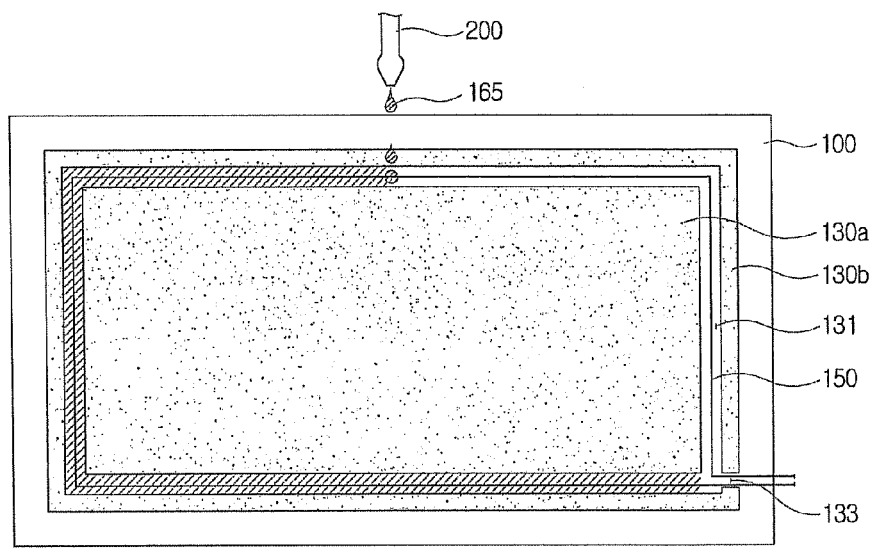

Hereinafter, a method of manufacturing the display device will be described in more detail with reference to FIGS. 5A to 5C. FIGS. 5A to 5C are plan views illustrating an exemplary manufacturing method of the display device according to the first exemplary embodiment of the present invention.

As shown in FIG. 5A, the filler 130 having the first region 130a and the second region 130b spaced from the first region 130a and formed at the circumference of the first region 130a, is formed on the insulating substrate 100 having the display part 110. The space 131 is defined between the first region 130a and the second region 130b. The filler 130 may comprise a sealant. As shown in FIG. 5A, the first region 130a may cover the display part 110 or may be formed at the circumference of the display part 110 not to cover the display part 110 in alternative exemplary embodiments. The filler 130 may be formed by a screen printer. To form the filler 130 as shown in FIG. 5A, the mask (not shown) which is formed in the screen printer may comprise a mask corresponding to the first and second regions 130a and 130b, and a block corresponding to the space 131 and the opening part 133. The insulating substrate 100 may be adhered to the cover substrate 120 after forming the filler 130 on the cover substrate 120.

Then, the filler 130 is semi-cured to form the heat wire 150 and the moisture absorbent 160 while maintaining its shape.

As shown in FIG. 5B, the heat wire 150 is formed in the space 131 by a sputtering or chemical vapor deposition ("CVD") method. Alternatively, a prefabricated heat wire 150 may be inserted into the space 131 instead of forming the heat wire 150 on the substrate 100. The heat wire 150 may comprise at least one of nickel, tungsten, kanthal and an alloy of at least one of the foregoing. After forming the heat wire 150 through a sputtering or CVD method, the end part of the heat wire 150 adjacent to the opening part 133 is connected with metal wires to expose the heat wire 150 through the opening part 133. Then, the heat wire 150 is connected with the power supply 170. When alternatively inserting a prefabricated heat wire 150 into the space 131, the end part of the heat wire 150 is exposed through the opening part 133.

Referring to FIG. 5C, the space 131 is filled with a moisture absorbent fluid 165. As shown in FIG. 5C, a dispenser 200 is driven along the space 131 while dropping the moisture absorbent fluid 165 into the space 131. Alternatively, the moisture absorbent fluid 165 may be formed in the space 131 through a screen-printing method. The moisture absorbent fluid 165 has very low moisture and oxygen transmittivity to prevent the organic light emitting layer from deteriorating.

The power supply 170 is connected with the end part of the heat wire 150, and then the insulating substrate 100 and the cover substrate 120 are adhered to each other. After adhering the insulating substrate 100 and the cover substrate 120, the heat wire 150 may be connected with the power supply 170. The filler 130 receives at least one of heat and light to be cured while the insulating substrate 100 and the cover substrate 120 are adhered to each other.

After curing the filler 130, the heat wire 150 receives power through the power supply 170, and the moisture absorbent fluid 165 is cured. The moisture absorbent fluid 165 may be cured at a temperature of about 70° C. to about 300° C. In exemplary embodiments, the adherence of two substrates 100 and 120 and the curing of the moisture absorbent fluid 165 may be performed in a vacuum or inert gas. The power supply 170 may comprise a known device which supplies electrical power, or an RF power source which supplies electrical power at high frequency. The power supply 170 does not belong to the elements of the OLED 1, and is removed after curing the moisture absorbent fluid 165 into the moisture absorbent 160. The opening part 133 is sealed to complete the OLED 1 as shown in FIG. 2. After curing the moisture absorbent 160 and before sealing the opening part 133, the heat wire 150 may be removed. The OLED 1 may effectively prevent moisture and oxygen from being introduced to the two substrates 100 and 120.

Figure 6:
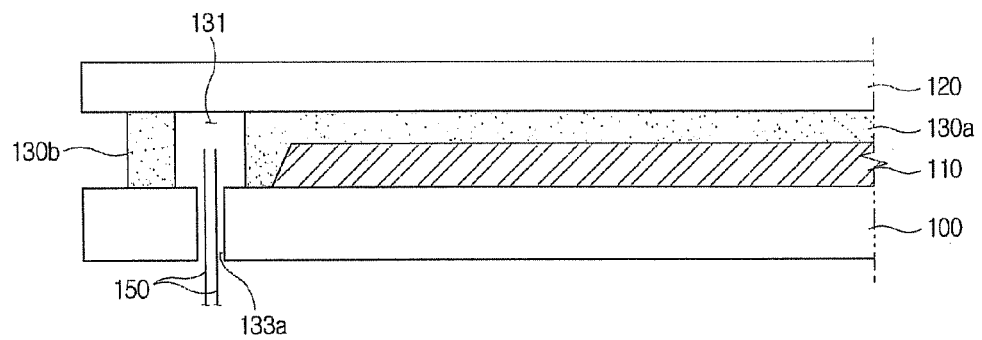
FIG. 6 is a partial cross sectional view illustrating a display device according to a second exemplary embodiment of the present invention.
Figure 7:
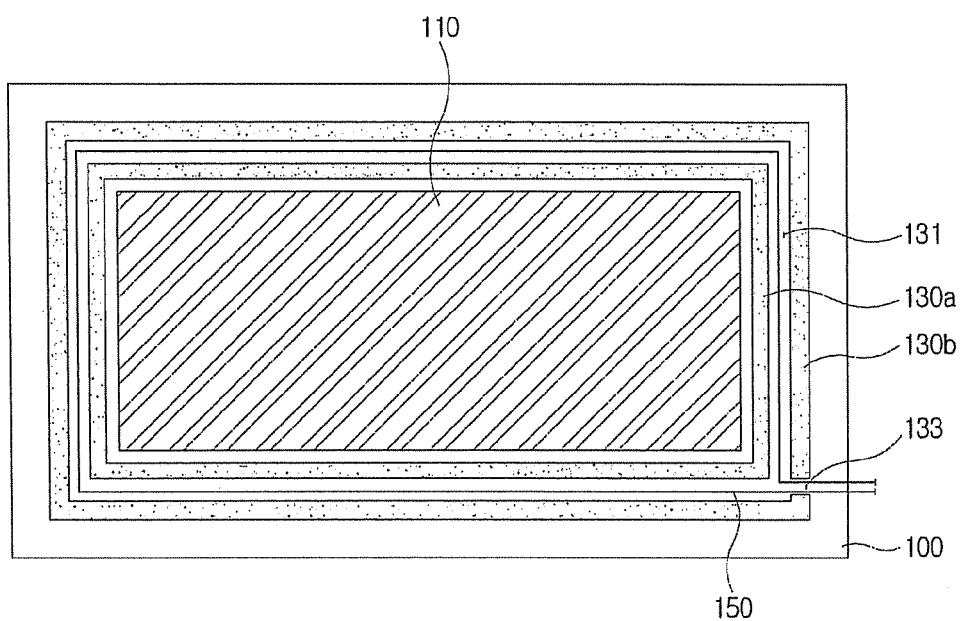
FIG. 7 is a plan view illustrating a display device according to a third exemplary embodiment of the present invention.

Referring to FIGS. 6 and 7, a display device according to second and third exemplary embodiments, respectively, of the present invention will be described.

FIG. 6 is a cross-sectional view of the display device according to the second exemplary embodiment of the present invention. As shown therein, an exposure hole 133a is formed through an insulating substrate 100 and aligned with a space 131 defined by first and second regions 130a and 130b. A heat wire 150 according to the second exemplary embodiment of the present invention is exposed to the outside through the exposure hole 133a of the insulating substrate 100 to be connected with a power supply 170 (refer to FIG. 1). The exposure hole 133a through the insulating substrate 100 is formed by an etching process, and is sealed after curing a moisture absorbent 160 in the space 131. Alternatively, the exposure hole 133a may be formed through a cover substrate 120 and aligned with the space 131.

FIG. 7 is a plan view illustrating the display device according to the third exemplary embodiment of the present invention. As shown in FIG. 7, a first region 130a is formed at a circumference of an insulating substrate 100. That is, the first region 130a of a filler 130 according to the third exemplary embodiment of the present invention does not cover a display part 110, different from the first region 130a of FIGS. 5A-5C described above. An opening part 133 is formed on a lateral side of the filler 130. A heat wire 150 is exposed through the opening part 133.

As described above, the present invention provides a display device which minimizes introduction of oxygen and moisture from the outside, and a manufacturing method thereof.

Although a few exemplary embodiments of the present invention have been shown and described, it will be appreciated by those skilled in the art that changes may be made in these exemplary embodiments without departing from the principles and spirit of the present invention, the scope of which is defined in the appended claims and their equivalents.

What is claimed is:

1. A display device, comprising:
   an insulating substrate;
   a display part formed on the insulating substrate;
   a cover substrate combined with the insulating substrate;
   a filler which is provided between the insulating substrate and the cover substrate, wherein the filler is located at a first region and a second region that is separated from the first region, and wherein a space is defined between the first region and the second region; and
   a moisture absorbent that fills the space between the first region and the second region, such that the moisture absorbent is directly contacting the insulating substrate and the cover substrate; and
   wherein the second region is formed along an edge of the first region such that the first region is surrounded by the second region with the filled space between the first region and the second region.

2. The display device according to claim 1, further comprising:
   a heat wire disposed in the moisture absorbent.

3. The display device according to claim 2, wherein the heat wire is one of a prefabricated heat wire disposed in the moisture absorbent and formed on the insulating substrate.

4. The display device according to claim 2, wherein the filler comprises a sealant which adheres the insulating substrate and the cover substrate together.

5. The display device according to claim 4, wherein the filler comprises an organic material.

6. The display device according to claim 5, wherein the first region covers the entire display part.

7. The display device according to claim 6, wherein the first region is formed along an edge of the insulating substrate.

8. The display device according to claim 7, wherein the first region is formed along an edge of the display part.

9. The display device according to claim 6, wherein the insulating substrate comprises a display region having a gate line and a data line insulatively crossing each other, and a non-display region provided along an edge of the display region, and the insulating substrate further comprising: a driving voltage supply provided in the non-display region and a common voltage supply provided between gate pads of the gate line.

10. The display device according to claim 9, wherein the driving voltage supply comprises a driving voltage bar extending parallel with the gate line, and a driving voltage pad connected with the driving voltage bar, and the heat wire overlaps a part of the driving voltage supply and/or the common voltage supply.

11. The display device according to claim 10, wherein the heat wire varies in width in an overlapping part and nonoverlapping part thereof.

12. The display device according to claim 10, wherein the width of the heat wire which does not overlap the driving voltage supply and/or the common voltage supply is larger than the width thereof which overlaps the at least one of the driving voltage supply and the common voltage supply.

13. The display device according to claim 10, wherein the width of the space is about 0.5 mm to about 20 mm.

14. The display device according to claim 13, wherein the moisture absorbent is a liquid which is dropped in the space, and cured by heat.

15. The display device according to claim 14, wherein the heat wire is exposed between the insulating substrate and the cover substrate.

16. The display device according to claim 14, wherein an exposure hole is formed on one of the insulating substrate or the cover substrate, and the heat wire is exposed through the exposure hole.

17. A method of manufacturing a display device, comprising:
   forming a display part on an insulating substrate;
   forming a filler located at a first region and a second region, wherein the second region is spaced from the first region and formed on the insulating substrate;
   disposing a heat wire in a space between the first region and the second region;
   forming a moisture absorbent in the space to cover the heat wire;
   adhering the insulating substrate to a cover substrate, wherein the moisture absorbent fills the space such that the moisture absorbent is directly contacting the insulating substrate and the cover substrate, and wherein the second region is formed along an edge of the first region such that the first region is surrounded by the second region with the filled space between the first region and the second region;
   and curing the moisture absorbent by supplying power to the heat wire.

18. The method according to claim 17, further comprising:
   semi-curing the filler before the disposing the heat wire.

19. The method according to claim 18, wherein the filler comprises an organic material and is formed by a screen printer.

20. The method according to claim 17, wherein the moisture absorbent is liquid, and is disposed by one of a dispenser or screen-printing method.

21. The method according to claim 20, wherein the curing the moisture absorbent comprises supplying power to the heat wire to rise to a temperature of about 70° C. to about 300° C.

22. The method according to claim 21, wherein the curing the moisture absorbent comprises curing the moisture absorbent in a vacuum and inert gas.

23. The method according to claim 22, wherein the filler comprises an opening part to expose the heat wire between the insulating substrate and the cover substrate, and the method further comprises:
   sealing the opening part after curing the moisture absorbent.

24. The method according to claim 22, wherein an exposure hole is formed on one of the insulating substrate or the cover substrate to expose the heat wire, and the method further comprises:
   sealing the exposure hole after curing the moisture absorbent.

25. The method according to claim 22, further comprising:
   removing the heat wire after curing the moisture absorbent.

* * * * *